US011991864B2

(12) United States Patent
Tong

(10) Patent No.: US 11,991,864 B2
(45) Date of Patent: May 21, 2024

(54) LOAD VECTORING HEAT SINK

(71) Applicant: Google LLC, Mountain View, CA (US)

(72) Inventor: Ryan Tong, Hercules, CA (US)

(73) Assignee: Google LLC, Mountain View, CA (US)

( * ) Notice: Subject to any disclaimer, the term of this patent is extended or adjusted under 35 U.S.C. 154(b) by 139 days.

(21) Appl. No.: 17/696,127

(22) Filed: Mar. 16, 2022

(65) Prior Publication Data

US 2023/0301029 A1 Sep. 21, 2023

(51) Int. Cl.
*H05K 7/20* (2006.01)
*G06F 1/20* (2006.01)

(52) U.S. Cl.
CPC ....... H05K 7/2049 (2013.01); H05K 7/20418 (2013.01); *G06F 1/20* (2013.01)

(58) Field of Classification Search
CPC .... H05K 7/2049; H05K 7/20418; G06F 1/20; H01L 23/4006
See application file for complete search history.

(56) References Cited

U.S. PATENT DOCUMENTS

| | | | | |
|---|---|---|---|---|
| 3,461,769 A * | 8/1969 | Brosseit | ................ | F16B 5/0233 |
| | | | | 411/395 |
| 5,010,949 A * | 4/1991 | Dehaine | .............. | H01L 23/4006 |
| | | | | 165/185 |
| 5,713,690 A | 2/1998 | Corbin, Jr. et al. | | |
| 6,280,202 B1 | 8/2001 | Alden, III et al. | | |
| 6,307,748 B1 | 10/2001 | Lin et al. | | |
| 6,480,387 B1 | 11/2002 | Lee et al. | | |
| 6,501,658 B2 * | 12/2002 | Pearson | .............. | H01L 23/4093 |
| | | | | 361/698 |
| 6,545,879 B1 * | 4/2003 | Goodwin | ............. | H05K 7/1053 |
| | | | | 361/709 |
| 6,639,800 B1 | 10/2003 | Eyman et al. | | |
| 6,778,396 B2 | 8/2004 | Liu | | |
| 6,826,054 B2 | 11/2004 | Liu | | |
| 7,019,979 B2 * | 3/2006 | Wang | .................... | H01L 23/367 |
| | | | | 174/16.3 |
| 7,042,727 B2 | 5/2006 | Ulen et al. | | |
| 7,080,989 B2 * | 7/2006 | Gates | .................. | H01L 23/4006 |
| | | | | 257/E23.084 |
| 7,126,823 B2 * | 10/2006 | Chen | ................... | H01L 23/4093 |
| | | | | 24/453 |

(Continued)

FOREIGN PATENT DOCUMENTS

CN 103596405 A 2/2014
EP 1081994 A2 3/2001

OTHER PUBLICATIONS

Extended European Search Report for European Patent Application No. 20213025.8 dated Jun. 7, 2021. 8 pages.

(Continued)

*Primary Examiner* — Emmanuel E Duke
(74) *Attorney, Agent, or Firm* — Lerner David LLP

(57) ABSTRACT

A heat sink includes multiple load points and a plurality of load cell for each of the load points. Each of the load cells is configured to attach to a respective attachment point on a component and to create a tensile load between the respective attachment point of the component and a respective one of the load points of the heat sink. At least one of the load cells is configured to produce a different maximum tensile load than another load cell among the plurality of load cells.

20 Claims, 4 Drawing Sheets

(56) References Cited

U.S. PATENT DOCUMENTS

| | | |
|---|---|---|
| 7,262,969 B2 | 8/2007 | Lee et al. |
| 7,315,449 B2 | 1/2008 | Lewis |
| 7,333,340 B2 | 2/2008 | Zhang et al. |
| 7,342,796 B2 | 3/2008 | Aukzemas |
| 7,345,881 B2 | 3/2008 | Colbert et al. |
| 7,359,200 B2 | 4/2008 | Zhou et al. |
| 7,468,889 B2 | 12/2008 | Su |
| 7,474,532 B1 * | 1/2009 | Desrosiers .......... H01L 23/4006 165/185 |
| 7,839,644 B2 | 11/2010 | Ye et al. |
| 7,870,888 B2 * | 1/2011 | Zhou .................... H01L 23/467 361/709 |
| 8,432,698 B2 | 4/2013 | Liu |
| 9,591,781 B2 | 3/2017 | Vanderveen et al. |
| 9,659,804 B2 | 5/2017 | Ke et al. |
| 10,861,771 B2 * | 12/2020 | Wu ..................... H01L 23/4006 |
| 10,978,372 B1 | 4/2021 | Tong |
| 11,071,195 B1 | 7/2021 | Tong |
| 11,696,427 B2 * | 7/2023 | Yin ..................... H05K 13/0069 29/832 |
| 2002/0114137 A1 | 8/2002 | Pearson et al. |
| 2004/0057212 A1 * | 3/2004 | Russell ............... H01L 23/4006 165/185 |
| 2004/0105236 A1 | 6/2004 | Lee et al. |
| 2004/0264142 A1 | 12/2004 | Mejia et al. |
| 2005/0036289 A1 | 2/2005 | Lee et al. |
| 2005/0072558 A1 | 4/2005 | Whitney et al. |
| 2005/0083661 A1 | 4/2005 | Lee et al. |
| 2005/0135064 A1 | 6/2005 | Chen et al. |
| 2005/0265803 A1 * | 12/2005 | Aukzemas ............ F16B 5/0241 411/372 |
| 2006/0007659 A1 | 1/2006 | Lee et al. |
| 2007/0019381 A1 | 1/2007 | Veh |
| 2007/0047208 A1 | 3/2007 | Zhou et al. |
| 2007/0091576 A1 | 4/2007 | Wung et al. |
| 2007/0097648 A1 | 5/2007 | Xu et al. |
| 2007/0217159 A1 | 9/2007 | Long et al. |
| 2007/0230125 A1 | 10/2007 | Lo et al. |
| 2008/0151504 A1 | 6/2008 | Eckberg et al. |
| 2008/0174952 A1 | 7/2008 | Ye et al. |
| 2008/0284005 A1 | 11/2008 | Wong |
| 2008/0310118 A1 | 12/2008 | Brocklesby et al. |
| 2009/0093142 A1 | 4/2009 | Lin et al. |
| 2010/0097766 A1 | 4/2010 | Wu et al. |
| 2010/0122458 A1 | 5/2010 | Woods, Jr. et al. |
| 2010/0220447 A1 | 9/2010 | Nie et al. |
| 2010/0226102 A1 | 9/2010 | So et al. |
| 2011/0038125 A1 | 2/2011 | Cao et al. |
| 2011/0103016 A1 | 5/2011 | Tang et al. |
| 2013/0189049 A1 | 7/2013 | Stotz, Jr. |
| 2014/0362528 A1 | 12/2014 | Takeuchi et al. |
| 2015/0062827 A1 | 3/2015 | Aizawa et al. |
| 2015/0152906 A1 | 6/2015 | Lai et al. |
| 2019/0200479 A1 | 6/2019 | Yatskov et al. |
| 2019/0269005 A1 | 8/2019 | He et al. |
| 2019/0304869 A1 | 10/2019 | Larson et al. |
| 2019/0306985 A1 | 10/2019 | Ferguson et al. |

OTHER PUBLICATIONS

Extended European Search Report for European Patent Application No. 22188774.8 dated Aug. 23, 2023. 5 pages.

\* cited by examiner

LOAD VECTORING HEAT SINK

BACKGROUND

Information technology ("IT") or computing equipment generates heat during operation and tends to operate more efficiently and fail at lower rates when cooled. For this reason, cooling systems for computing equipment have been developed. For some computer hardware components, cooling solutions include heat sinks that can be mounted directly to the component.

To compensate for irregularity of surfaces of the component and the heat sink, thermal paste or another fluid with favorable thermal conductivity may be applied between the component and a component-contacting surface of the heat sink. The portion of fluid between the component and the component-contacting surface of the heat sink may be referred to as a bond line.

Heat transfer from the component to the heat sink is typically greater where pressure between the component and the heat sink is greater and where the bond line is thinner Greater pressure is also usually observed where the bond line is thinner. The distribution of bond line thickness and pressure between a heat sink and a component usually results from unintended surface irregularities of either or both of the heat sink and the component. Such irregularities may not align points with high pressure or a thin bond line with the portions of the component that have the greatest need for heat dissipation. As such, a solution for creating an intended load distribution between a component and a heat sink could improve cooling efficiency.

BRIEF SUMMARY

Aspects of this disclosure are directed to a heat sink adapted to provide a vectored, or intentionally uneven, load across multiple points of attachment to a component to be cooled. The heat sink may include multiple load cells, with each of the load cells being configured to provide a tensile load between a respective load point on the heat sink and a respective attachment point on the component. At least one of the load cells may be adapted to provide a different tensile load than another of the load cells. The load that any of the load cells is adapted to provide may be at a predefined condition of the load cells, such as when the load cells are tightened to a maximum degree. Thus, in some examples, at least one of the load cells may have a different maximum tensile load capacity than another of the load cells. In further examples, some or all of the load cells may be adapted to provide different tensile loads than any number of the other load cells. Some or all of load cells may be adapted to provide different loads from one another by varying any aspect between load cells. Such a varied aspect may be, for example, elastic properties of respective biasing components in the load cells. In further examples, the varied aspect may be sizes of respective spaces within which the biasing components are confined. In further examples, the varied aspect may be respective differences between minimally and maximally loaded positions of the load cells. In still further examples, the component itself may be adapted so that identical load cells may produce different tensile loads at different attachment points of the component.

Other aspects of this disclosure are directed to determining an optimal load distribution and designing heat sinks or components to achieve the optimal load distribution. An optimal load distribution for a given component may be experimentally determined by tightening test load cells, which may be standard or non-preconfigured, on a heat sink attached to a given component by differing amounts and measuring the results. In some examples, the optimal load distribution may be found by measuring the thermal performance of the heat sink at various load distributions. In such examples, the optimal load distribution may be the load distribution that results in the greatest heat loss from the heat sink or that keeps the component at the lowest temperatures while the component operates. In further examples, a pressure sensor can be disposed between the heat sink and the component, and the pressure distribution may be observed as the load cells are tightened to varying degrees. In such examples, an optimal load distribution may be chosen by finding the configuration that best matches a target load distribution derived from the known geometry and hot spots of the component. In further examples, the pressure sensor may be used together with measurement of thermal performance of the heat sink to find a load distribution that results in the best thermal performance. Heat sinks or components may be designed to produce the optimal load distribution according to any of the method for adapting a heat sink or component to create a vectored load described herein.

In another aspect, a heat sink may comprise a plurality of load points. The heat sink may also comprise a plurality of load cells each configured to attach to a respective attachment point on a component and to create a tensile load between the respective attachment point and a respective one of the load points. At least one load cell among the plurality of load cells may be configured to have a different maximum tensile load than another load cell among the plurality of load cells.

In some arrangements according to any of the foregoing, each load cell among the plurality of load cells may comprise a spring and a screw. The screw may include a head. The spring may be trapped between the head and a respective one of the load points.

In some arrangements according to any of the foregoing, each load cell among the plurality of load cells may comprise a washer disposed between the head and the load point. At least one of the washers may be different in thickness than another of the washers.

In some arrangements according to any of the foregoing, the plurality of load cells may comprise a first load cell and a second load cell. The first load cell may include a first head, a first spring, and a washer disposed between the first head and the first spring. The second load cell may include a second head and a second spring that abuts the second head.

In some arrangements according to any of the foregoing, the heat sink may comprise a heat receiving surface, and wherein at least one of the load points is a different distance from the heat receiving surface along an axis that is normal to the heat receiving surface than another of the load points.

In some arrangements according to any of the foregoing, at least one of the springs may have a different spring constant than another of the springs.

In some arrangements according to any of the foregoing, at least one of the springs may have a different neutral length than another of the springs.

In some arrangements according to any of the foregoing, each screw may include a threaded portion. At least one of the threaded portions may have a different length than another of the threaded portions.

In another aspect, a computer hardware component may comprise a chip. The component may also comprise a board supporting the chip. The component may also comprise a plurality of standoffs connected to the board configured for coupling a heat sink to the board. At least one standoff among the plurality of standoffs may have a different height than another standoff among the plurality of standoffs.

In some arrangements according to any of the foregoing, each standoff may include a threaded portion. At least one of the threaded portions may be different in length than another of the standoffs.

In another aspect, a method of tuning a load distribution may comprise mounting a test heat sink to a test component to be cooled using adjustable load cells. The method may also comprise adjusting tensile loads applied by the adjustable load cells such that at least one of the adjustable load cells creates a different tensile load between the test heat sink and the test component than another of the adjustable load cells to create a first load distribution. The method may also comprise measuring heat output from the test heat sink while the test component operates and the adjustable load cells maintain the first load distribution. The method may also comprise, after measuring a performance of the first load distribution, adjusting at least one of the tensile loads to create a second load distribution. The method may also comprise measuring heat output from the test heat sink while the test component operates and the adjustable load cells maintain the second load distribution.

In some examples according to any of the foregoing, the method may comprise disposing a pressure sensor between the test heat sink and the test component and measuring pressure distribution between the test heat sink and the test component while the adjustable load cells maintain the first load distribution and while the adjustable load cells maintain the second load distribution.

In some examples according to any of the foregoing, the first load distribution and the second load distribution may be among a plurality of evaluated load distributions and the method may comprise, for each evaluated load distribution among the plurality of evaluated load distributions, measuring heat output from the test heat sink while the test component operates and the adjustable load cells maintain the second load distribution. The method may also comprise selecting an optimal load distribution from among the plurality of evaluated load distributions, the optimal load distribution being an evaluated load distribution among the plurality of evaluated load distributions that results in a greatest measured heat output from the test heat sink while the test component operates.

In some examples according to any of the foregoing, the test component may be constructed according to a preliminary component design and the method includes creating a modified component design from the preliminary component design, wherein mounting the test heat sink to a component constructed according to the modified component design and tightening each of the adjustable load cells to a respective maximum possible load would create the optimal load distribution between the test heat sink and the component constructed according to the modified component design, and the respective maximum possible load of at least one of the adjustable load cells is limited by the modified component design.

In some examples according to any of the foregoing, creating the modified component design may include altering a height of at least one standoff among a plurality of standoffs in the preliminary component design that are configured for coupling the adjustable load cells to a board in the preliminary component design so that the height of the at least one standoff differs from a height of another standoff among the plurality of standoffs.

In some examples according to any of the foregoing, the test heat sink may include the adjustable load cells and is constructed according to a preliminary heat sink design and the method includes creating a modified heat sink design from the preliminary heat sink design, wherein mounting a modified heat sink constructed according to the modified heat sink design to the test component and tightening each load cell of the modified heat sink to a respective maximum possible load would create the optimal load distribution between the modified heat sink and the test component.

In some examples according to any of the foregoing, creating the modified heat sink design may include causing at least one of the respective maximum possible loads to differ from a corresponding respective maximum possible load of a load cell in the preliminary heat sink design and from another of the respective maximum possible loads of the modified heat sink.

In some examples according to any of the foregoing, creating the modified heat sink design may include designing each load cell of the modified heat sink design to include a spring that governs the respective maximum possible load of the load cell of the modified heat sink, with at least one of the springs having a different neutral length or spring constant than another of the springs.

In some examples according to any of the foregoing, creating the modified heat sink design may include designing a first load cell among the load cells of the modified heat sink to include a first movable end, a first spring trapped between the first movable end and a first immovable load point of the modified heat sink, and a first washer trapped between the first spring of the first load cell and the first movable end or the first immovable load point. Creating the modified heat sink design may also include designing a second load cell among the load cells of the modified heat sink to include a second movable end and a second spring trapped between the second movable end and a second immovable load point of the modified heat sink and to either be free of washers between the second movable end and the second immovable load point or to include a second washer trapped between the spring and the second end or the second immovable load point having a different thickness than the first washer.

In some examples according to any of the foregoing, creating the modified heat sink design may include designing each load cell of the modified heat sink design to apply load to a respective immovable load point of the modified heat sink design, at least one of the immovable load points being spaced from a heat receiving surface of the heat sink that is configured to contact the test component by a different distance than a distance by which another of the immovable load points is spaced from the heat receiving surface.

DETAILED DESCRIPTION

All directional terms, such as "up," "down," "above," "below," "vertical," or "height" used in the following description refer only to the orientation of features as depicted in the figure being described. Such directional terms are not intended suggest that any features of the devices described herein must exist in any particular orientation when constructed.

Figure 1:
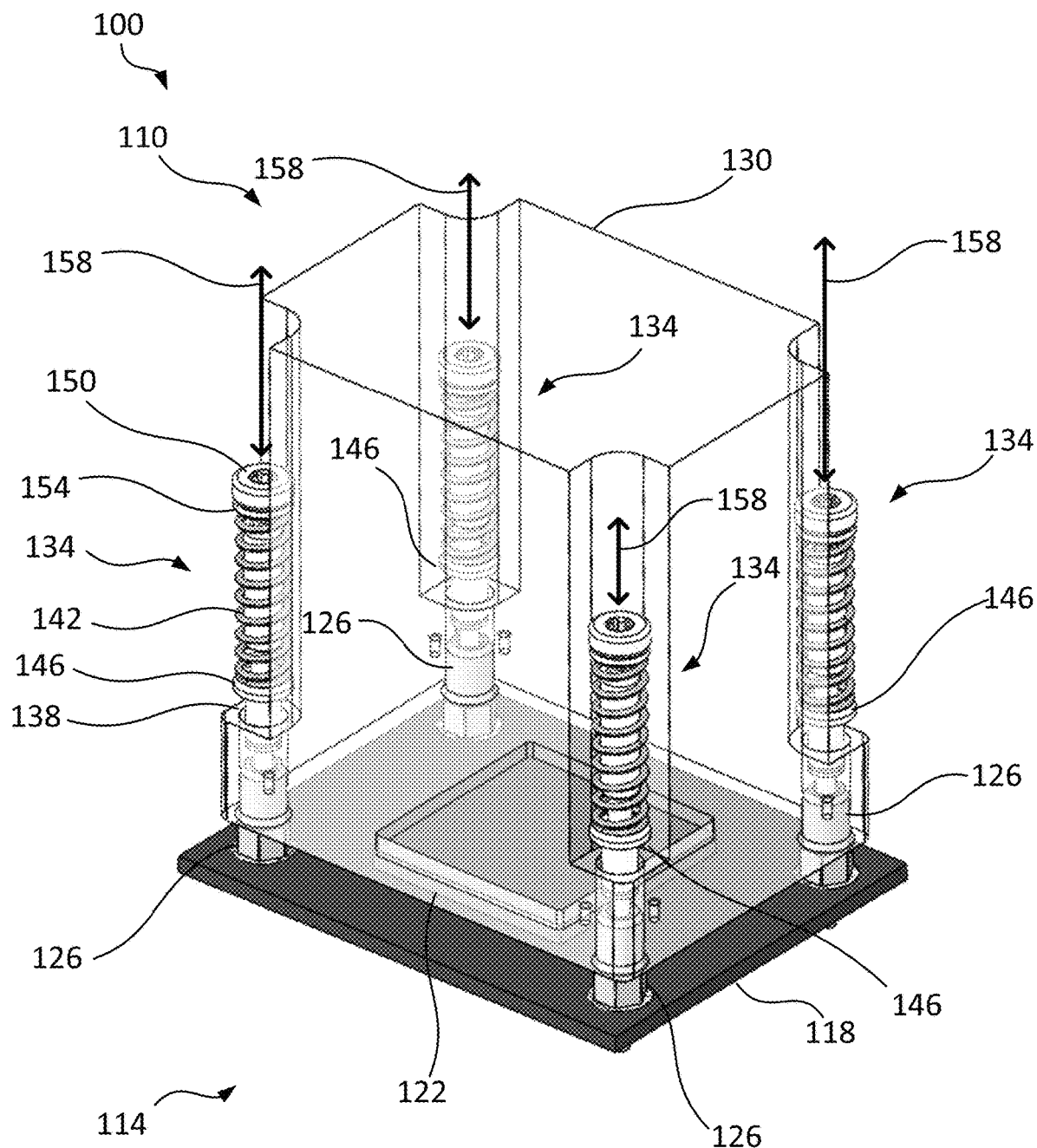
FIG. 1 is a perspective view of an assembly including a load vectored heat sink according to an aspect of the present disclosure.

FIG. 1 shows an assembly 100 that includes a load vectoring heat sink 110 and a computer hardware component 114 to which heat sink 110 is mounted. Computer hardware component 114 of the illustrated example includes a board 118, such as a printed circuit board, a chip 122, and four standoffs 126. Chip 122 can be any device from which heat should be conducted away, such as, for example, a processor, a collection of circuitry, or any other heat producing electronic element. Each of the standoffs 126 provides a connection point on component 114 for connecting heat sink 110 to component 114. In other examples, component 114 may include any number of standoffs 126 other than four. In further examples, component 114 may lack a board 118 distinct from chip 122, and in such examples the standoffs 126 or other connection points of component 114 may be located on chip 122 itself.

Heat sink 110 includes a block 130, which may be any device for dissipating or transferring heat. Block 130 may be, for example, a group of heat dissipating fins, a housing for fluid heat exchange conduits, or any other device capable of conveying heat away from chip 122.

Heat sink 110 also includes load cells 134 for creating a tensile load up to a maximum tensile load 158 between the standoffs 126 and respective load points 146 of heat sink 110. Each load point 146 is a feature at a fixed location on heat sink 110. Whereas heat sink 110 of the illustrated example includes four load cells 134, heat sinks of other examples may include other numbers of load cells.

Each load cell 134 of the illustrated example includes a screw 138, a washer 154, and a spring 142 coiled around the screw 138 and trapped between the washer 154 and the respective load point 146. Each screw 138 also includes a head 150 adapted for cooperation with a screwdriver and having a larger diameter than a shank of screw 138, preventing washer 154 and spring 142 from sliding off of the upper end of screw 138. Each spring 142 in the illustrated example is therefore trapped between both a head 150 and a washer 154 at one end and a load point 146 at an opposed end. In other examples, some or all of load cells 134 may lack a washer 154, and springs 142 of load cells lacking washers 154 may each be trapped directly between a respective head 150 and load point 146. In further examples, washers 154 may be placed adjacent load points 146 so that springs 142 would be trapped between a washer 154 and a load point 146 at one end and a head 150 at an opposed end.

Each screw 138 has a threaded end opposite from head 150 that threadedly engages a respective one of the standoffs 126. Each load cell 134 may therefore be tightened by turning screw 134 to advance the screw 134 further into standoff 126. Threadedly advancing screw 134 into standoff 126 reduces a space between the corresponding load point 146 and head 150, thereby compressing the corresponding spring 142. When any spring 142 is compressed, that spring 142 pushes the corresponding head 150 and load point 146 apart, which in turn causes the threaded portion of the corresponding screw 138 to pull upward on a corresponding threaded portion of standoff 126 and thereby creates a tensile load between the load point 146 and standoff 126. In other examples, load cells 134 may be configured to provide compressive or otherwise non-tensile loads between load points 154 and standoffs 126. A maximum load 158, which may be a tensile load, for a load cell 134 is created when the screw 138 of that load cell is threadedly advanced as far as possible in the direction that compresses spring 142. Maximum threaded advancement of screw 138 may be limited in any manner, such as by the length of the threaded portion of the screw 138, the length of the threaded receiving portion of the standoff 126, or by the presence of portions of screw 138 with larger diameter that abut against other portions of heat sink 110 or standoff 126 when screw 134 is advanced to a certain point.

The illustrated load cells 134 are only one example of how load cells suitable for the concepts of the present disclosure may be constructed, and load cells in other examples may have any other structure capable of creating a load, tensile or otherwise, between connection points on component 114 and fixed load points on heat sink 110. For example, load cells 134 in other arrangements may have springs 142 other than coil springs or elastic biasing elements other than springs. In other examples, load cells 134 may have latching or swing-locking constructions instead of screws 134.

Each load cell 134 of heat sink 110 is capable of providing a different maximum load 158, as represented by the differing lengths of the arrows symbolizing maximum loads 158 in FIG. 1. Moreover, each of the load cells 134 may have a different maximum load 158 as compared to other load cells 134. While in some examples some load cells 134 may have a same maximum load, in other examples one, some, or all of the load cells 134 may have a different maximum load 158 than any of the other load cells 134.

Figure 2:
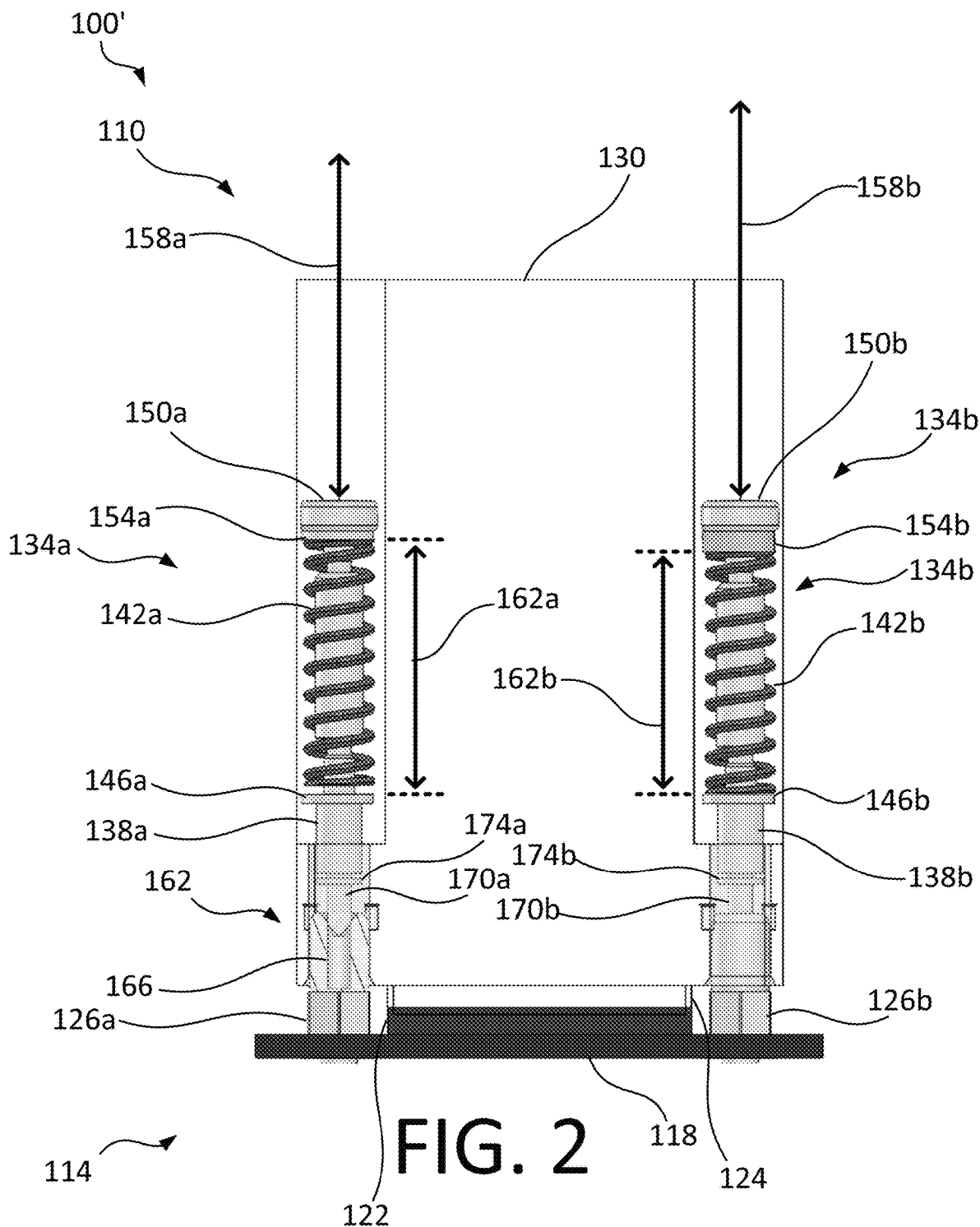
FIG. 2 is an elevation view of the assembly of FIG. 1.

FIG. 2 shows one example of an optimized assembly 100'. Optimized assembly 100' is one example of how assembly 100 may be preconfigured to have an intended uneven load distribution.

Of the four load cells 134, the four load points 146a, and the four standoffs 126, a first load cell 134a, a second load cell 134b, a first load point 146a, a second load point 146b, a first standoff 126a, and a second standoff 126b are visible in FIG. 2. First load cell 134a includes a first screw 138a, first head 150a of first screw 138a, a first spring 142a, and first washer 154a. First load cell 134a is placed to load first load point 146a and is threadedly engaged to first standoff 126a. Similarly, second load cell 134b is placed to load second load point 146b, and is threadedly engaged to second standoff 126b. Second load cell includes second screw 138b, second head 150b of second screw 138b, second spring 142b, and second washer 154b. First spring 142a is trapped in a first spring space 162a, and second spring 142b is trapped in a second spring space 162b. Spring spaces 162a, 162b are measured along the respective axes on which springs 142a, 142b are compressed or allowed to expand during operation of the load cells. Spring spaces 162a, 162b of the illustrated example are therefore measured along the axes about which springs 142a, 142b are coiled, though spring spaces 162a, 162b may be oriented otherwise in examples having springs 142a, 142b of different types or arrangements. Furthermore, while spring spaces 162a, 162b in the illustrated example are each defined between a corresponding one of the washers 154a, 154b and one of the load points 146a, 146b, spring spaces 162a, 162b may be defined between whichever other features of heat sink 110 are used to constrain springs 142a, 142b in other arrangements.

A partial cutaway 162 shows a cross section of an upper portion of first standoff 126a. As shown by the partial cutaway 162, first standoff 126a includes an internally threaded hole 166 for receiving and threadedly engaging a first threaded end 170a of first screw 138a. Though it is not visible in FIG. 2, a second internally threaded hole is similarly included in second standoff 126*b* for receiving and threadedly engaging a second threaded end 170*b* of second screw 138*b*. Each spring space 162*a*, 162*b* therefore decreases as the corresponding screw 138*a*, 138*b* is threadedly advanced into the corresponding standoff 126*a*, 126*b*, resulting in a tightening or increased tensile load of the corresponding load cell 134*a*, 134*b*. First screw 138*a* and second screw 138*b* include a first collar 174*a* and a second collar 174*b*, respectively. Collars 174*a*, 174*b* are located above the respective threaded ends 170*a*, 170*b*, and have diameters greater than diameters of the internally threaded holes 166 of the standoffs 126*a*. Thus, in the illustrated example, collars 174*a*, 174*b* limit advancement of threaded ends 170*a*, 170*b* into standoffs 126*a*, 126*b* so that collars 174*a*, 174*b* abut standoffs 126*a*, 126*b* when load cells 134*a*, 134*b* reach a maximally tightened position. However, in other examples, the tightening of load cells 134*a*, 134*b* may be limited in other ways.

Also visible in FIG. 2 is a boss 124 extending downward from a lower end of block 130. A lowermost face of boss 124 is pressed onto chip 122. The lowermost face of boss 124 is therefore a component-contacting surface of heat sink 110, meaning the surface intended to be pressed into contact with component 114 and through which heat from component 114 is intended to pass into block 130. Boss 124 is optional, so heat sinks 110 of other arrangements may have a component-contacting surface defined directly on a downward face of block 130. In either case, the component-contacting surface may include portions that do not actually contact the component 114, but which are thermally coupled to component 114 by a bond line of thermal paste or another thermally conductive substance. The component-contacting surface is therefore a heat-receiving surface for heat sink 110.

In the illustrated example, first load cell 134*a* and second load cell 134*b* are identical to one another, and to load cells 134 not visible in FIG. 2, except for washers 154*a*, 154*b*. Specifically, first washer 154*a* is thinner than second washer 154*b*. Because load cells 134*a*, 134*b* are otherwise identical, the greater thickness of second washer 154*b* will cause second spring space 162*b* to be smaller than first spring space 162*a* when both load cells 134*a*, 134*b* are in their maximally tightened positions. First spring 142*a* will therefore be less compressed and create less load than second spring 142*b* when both load cells 134*a*, 134*b* are in their maximally tightened positions. The greater thickness of second washer 154*b* compared to first washer 154*a*, while all other features of load cells 134*a*, 134*b* remain identical, thus causes second maximum load 158*b* to exceed first maximum load 158*a*. Tightening all load cells 134 of the heat sink 110 to their respective maximum loads 158 will therefore cause an uneven distribution of loads that results from the preconfiguration of the load cells 134 with washers 154 of differing thicknesses.

Varying washer 154 thicknesses between load cells 134 while holding other aspects of load cells 134 constant is only one example of how heat sink 110 can be preconfigured to create an intended uneven load distribution when mounted to component 114. Other aspects that can be varied between load cells 134 include, but are not limited to, the length of the threaded portion of threaded ends 170*a*, 170*b*, the location of collars 174*a*, 174*b*, the resilience of springs 142, the resting, neutral, or uncompressed lengths of springs 142, the distance between heads 150 and their respective threaded ends 170*a*, 170*b* or collars 174*a*, 174*b*, and the height of the load points 146 relative to the component-contacting surface of heat sink 110. In other examples, some at least one load cell 134 may lack a washer 154 altogether while at least one other load cell 134 includes a washer 154. Any of the foregoing aspects, including washer thickness, may be varied alone or in any combination while other aspects of load cells 134 are kept uniform.

Component 114 may also be preconfigured to receive an intended uneven load distribution when a heat sink 110 is mounted thereto. Component 114 may be preconfigured independently from heat sink 110, such that the intended load distribution would result when a heat sink 114 having uniform load cells 134 is mounted to the preconfigured component 114. In other examples, component 114 may be preconfigured to cooperate with a heat sink 110 that is preconfigured with non-uniform load cells 134 to create an intended non-uniform load distribution. Features of component 114 that can be varied, alone or in any combination, to preconfigure component 114 for a non-uniform load distribution include, but are not limited to, overall height of individual standoffs 126 and depths of internally threaded holes 166.

Figure 3A:
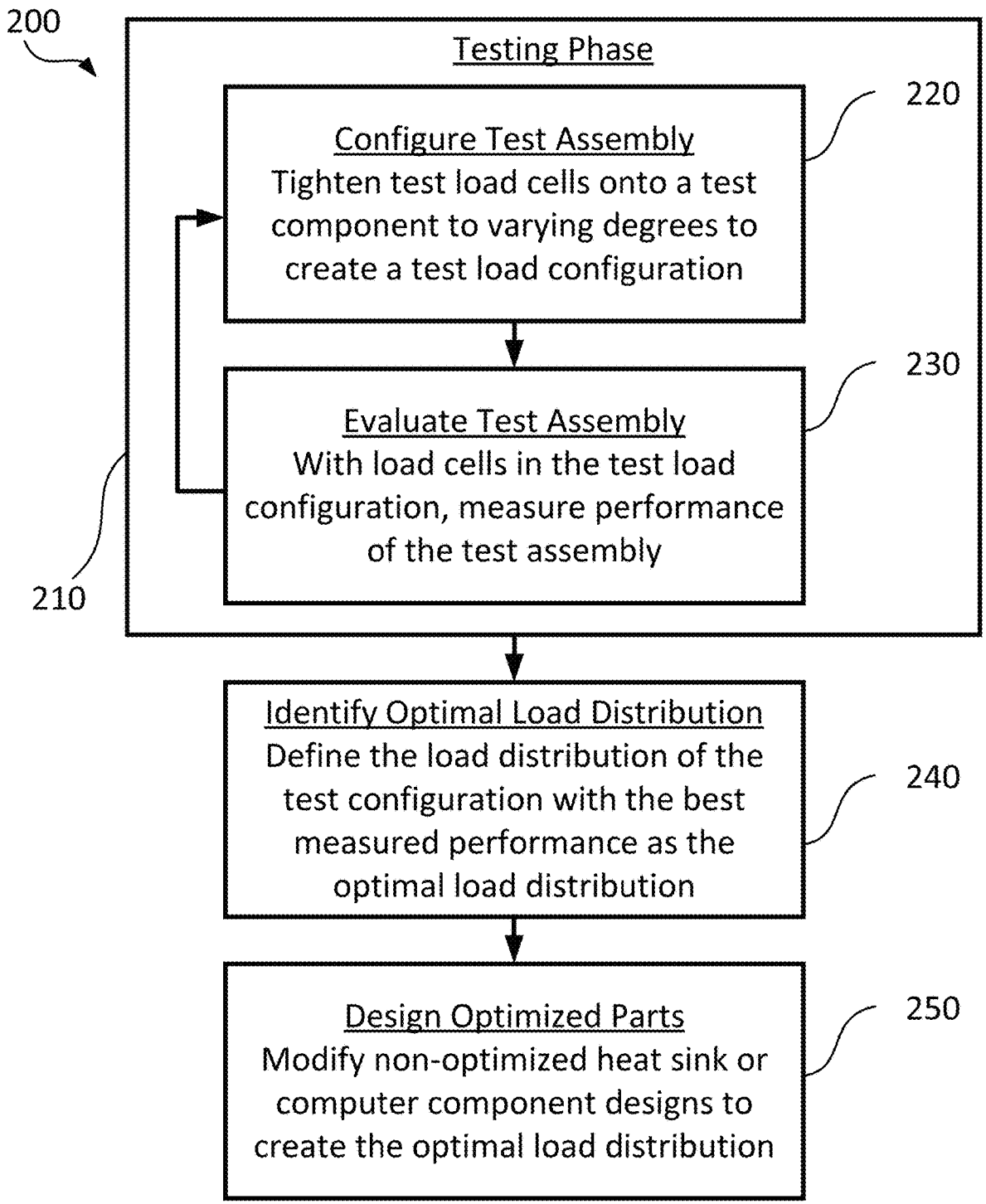
FIG. 3A is a flowchart of a process for finding an optimal a load distribution for a component.

FIG. 3A shows a process 200 for finding and producing an optimal load distribution for assemblies such as assembly 100. While the operations of the process 200 are described in a particular order, it should be understood that operations may be performed simultaneously or in a different order. Moreover, operations may be added or omitted.

In testing phase 210, one or more test assemblies 100 are used to evaluate different load distributions. Testing phase 210 includes configuring 220 one or more test assemblies 100 to have different distributions of load between heat sink 110 and component 114. In some examples, the configuring 220 portion of testing phase 210 can be conducted once by configuring multiple different test assemblies 100 prior to evaluation 230. In other examples, the configuring 220 portion of testing phase 210 can be conducted iteratively by reconfiguring one or more test assemblies 100 following one evaluation 230 and prior to another evaluation 230.

A test assembly 100 may be configured 220 by tightening the test assembly's 100 load cells 134 by different amounts. The configuring 220 may be done manually or with a tool, such as, for example, a digitally controlled screwdriver or wrench. For that purpose, test assemblies 100 may be constructed with load cells 134 capable of providing a wider range of loads than load cells that would ordinarily be provided for commercial or mass-produced heat sinks.

The test assembly may be evaluated 230 by measuring performance of the test assembly 100 according to one or more metrics. Some examples of such metrics include thermal metrics. Thermal metrics that may be measured during evaluation 230 include, for example, an operating temperature of a test component 114 within test assembly 100 or an amount or rate of heat exiting block 130 of a test heat sink 110 within test assembly 100 while test component 114 operates. Generally, lower operating temperatures of test components 114 and greater rates of heat exiting block 130 indicate better performance for a given load configuration. In implementations wherein a pressure sensor is placed between heat sink 110 and component 114 of the evaluated test assembly 100, a metric may be the similarity of a measured load distribution to an ideal load distribution.

When a satisfactory amount of information has been acquired from one or more evaluations 230, an optimal load distribution may be identified (block 240). Identification 240 includes analysis of results from evaluation 230 to find a load distribution that results in the best performance according to the evaluated metric or metrics, with the load distribution that results in the best performance being identified as an optimal load distribution. Where only one metric is considered, the optimal load distribution may be, for example, the load distribution that results in the lowest operating temperature for component 114, the greatest amount or rate of heat exiting heat sink 110 or block 130, or the greatest similarity to an ideal load distribution. Where multiple metrics are considered, some or all of the metrics may be assigned threshold acceptable values, and load distributions found to have performance results outside of the acceptable values may be disregarded. Where multiple metrics are considered beyond a binary determination of whether the performance results are acceptable, the evaluated load distributions may be scored by weighting those metrics.

Identification 240 may be the designation of one of the load distributions as the optimal load distribution based upon results of the evaluation 230. In some examples, identification 240 may include extrapolation from the results found during evaluation 230 to predict the performance of load distributions that were not actually evaluated.

Designing 250 optimized parts, may include designing parts that are preconfigured by any of the approaches described above for preconfiguring heat sinks 110 or components 114 to have intentionally uneven load distributions. Designed parts are preconfigured to create an assembly such as assembly 100 that has the optimal load distribution when all load cells 134 are tightened by an intended amount. For example, an optimized heat sink 110 may be designed to create the optimal load distribution when mounted to a given type of component 114 with all load cells 134 tightened to a maximum amount. In other examples, an optimized component 114 may be designed to create the optimal load distribution when a given type of heat sink 110 is mounted to the optimized component 114 with all load cells 134 tightened to a maximum amount.

Designing 250 may include modifying preliminary part designs to achieve the intended configuration. The preliminary part designs may be generally alike to the test parts. As such, designing 250 an optimized heat sink 110 may include beginning from a preliminary heat sink design that is similar to the test heat sink 110, then modifying that preliminary heat sink design to create a heat sink 110 preconfigured to create the intended load distribution. Similarly, designing 250 an optimized component 114 may include beginning from a preliminary component design that is similar to the test component 114, then modifying that preliminary component design to create a component 114 that is preconfigured to create the intended load distribution.

Optimized parts designed according to process 200 can compensate for hot spots in components 114 and for surface irregularities of components 114 and heat sinks 110, which are difficult to eliminate but tend to be consistent across components 114 or heat sinks 110 of the same type. Process 200 could therefore be used with a test component 114 of a given type to design a heat sink 110 that is optimized for that type of component 114. In other examples, process 200 could be used with a test component 114 so that an optimized version of that component could be designed and marketed for use with standard, non-optimized heat sinks 110. In further examples, optimized heat sinks 110 and components 114 could be designed for use with one another.

Figure 3B:
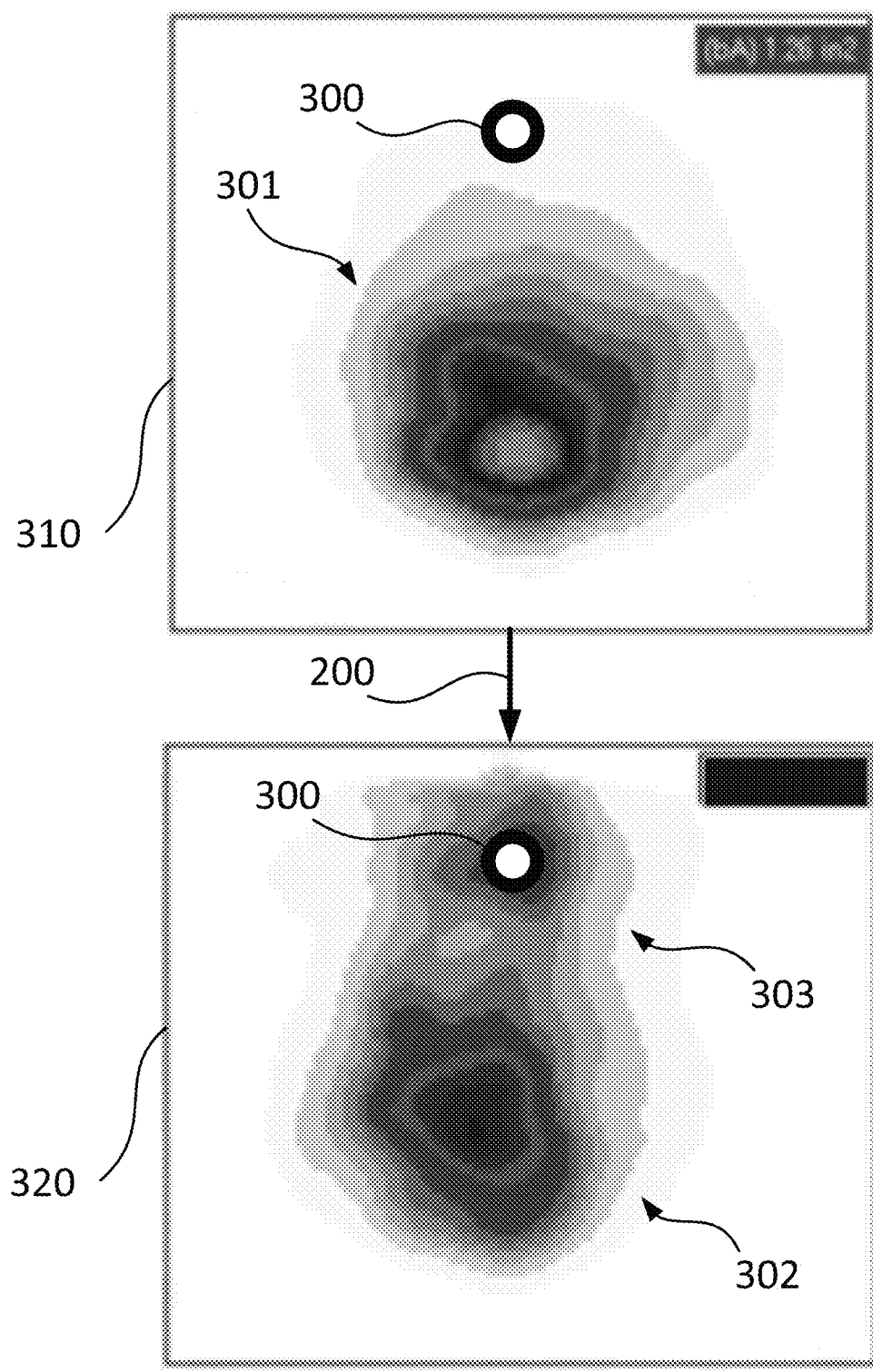
FIG. 3B illustrates a non-optimal load distribution for a component and an optimal load distribution for the component that may result from the process of FIG. 3A.

FIG. 3B illustrates a non-optimal load distribution 310, which may occur in a test assembly 100 or an assembly of a non-optimized heat sink and a non-optimized component, and an optimal load distribution 320 that may be found with process 200. In both load distributions 310, 320, the load gradient is represented by shade. A known hot spot 300 resulting from the architecture of the relevant component type is shown on both load distributions. It is usually preferable to prioritize cooling of hot spot 300.

Non-optimal load distribution 310 includes an unintended high-pressure zone 301. In non-optimized assemblies, such unintended high-pressure zones 301 typically result from unplanned surface irregularities on the heat sink, the component, or both. As a result, unintended high-pressure zone 301 may not extend over hot spot 300, as shown in the illustrated example.

Optimal load distribution 320 in the illustrated example includes a planned high pressure zone 303 that extends over hot spot 300, which results in greater heat transfer from hot spot 300 to a heat sink than non-optimal load distribution. The illustrated example of optimal load distribution 320 includes an artifact 302 of unintended high-pressure zone 301, but artifact 302 is lesser in size and magnitude than unintended high-pressure zone 301. The presence of an artifact 302 that is distinct from planned high pressure zone 303 and the general load profile of optimal load distribution 320 shown in FIG. 3B are aspects of merely one example of how an optimal load distribution 320 may look. Optimal load distributions 320 derived from different components, heat sinks, or metrics can vary greatly.

Although the concept herein has been described with reference to particular examples, it is to be understood that these examples are merely illustrative of the principles and applications of the present concept. It is therefore to be understood that numerous modifications may be made to the illustrative examples and that other arrangements may be devised without departing from the spirit and scope of the present concept as defined by the appended claims.

The invention claimed is:

1. A heat sink comprising:
   a plurality of load points; and
   a plurality of load cells each configured to attach to a respective attachment point on a component and to create a load between the respective attachment point and a respective one of the load points,
   wherein a first load cell of the plurality of load cells comprises a first plurality of elements, the first plurality of elements configured to collectively create a first maximum load between a first attachment point and a respective first load point;
   wherein a second load cell of the plurality of load cells comprises a second plurality of elements corresponding to the first plurality of elements, the second plurality of elements configured to collectively create a second maximum load between a second attachment point and a respective second load point, the second maximum load different than the first maximum load, and
   wherein at least one of the first plurality of elements is structurally distinct from corresponding one of the second plurality of elements.

2. The heat sink of claim 1, wherein the first and second plurality of components comprises, respectively, a first spring and a first screw and a second spring and a second screw, the first and second screws including, respectively, a first head and a second head, the first spring is trapped between the first head and the first load point.

3. The heat sink of claim 2, wherein the first and second plurality of components comprises, respectively, a first washer disposed between the first head and the first load point, a second washer disposed between the second head and the second load point, and at least one of the first and second washers is different in thickness than another of the first and second washers.

4. The heat sink of claim 2, comprising a heat receiving surface, and wherein at least one of the load points is a different distance from the heat receiving surface along an axis that is normal to the heat receiving surface than another of the load points.

5. The heat sink of claim 2, wherein at least one of the first and second springs has a different spring constant than another of the first and second springs.

6. The heat sink of claim 2, wherein at least one of the first and second springs has a different neutral length than another of the first and second springs.

7. The heat sink of claim 2, wherein the first and second screws includes, respectively, a first threaded portion, and a second threaded portion, and at least one of the first and second threaded portions has a different length than another of the first and second threaded portions.

8. The heat sink of claim 1, wherein the first load cell including a first head, a first spring, and a first washer disposed between the first head and the first spring, and the second load cell including a second head and a second spring that abuts the second head.

9. A computer hardware component comprising:
a chip;
a board supporting the chip; and
a plurality of standoffs connected to the board configured for coupling a heat sink to the board, wherein at least one standoff among the plurality of standoffs has a different height than another standoff among the plurality of standoffs.

10. The component of claim 9, wherein each standoff includes a threaded portion, and at least one of the threaded portions is different in length than another of the standoffs.

11. A method of tuning a load distribution, the method comprising:
mounting a test heat sink to a test component to be cooled using adjustable load cells;
adjusting loads applied by the adjustable load cells such that at least one of the adjustable load cells creates a different load between the test heat sink and the test component than another of the adjustable load cells to create a first load distribution;
measuring heat output from the test heat sink while the test component operates and the adjustable load cells maintain the first load distribution;
after measuring a performance of the first load distribution, adjusting at least one of the loads to create a second load distribution; and
measuring heat output from the test heat sink while the test component operates and the adjustable load cells maintain the second load distribution.

12. The method of claim 11, comprising disposing a pressure sensor between the test heat sink and the test component and measuring pressure distribution between the test heat sink and the test component while the adjustable load cells maintain the first load distribution and while the adjustable load cells maintain the second load distribution.

13. The method of claim 11, wherein the first load distribution and the second load distribution are among a plurality of evaluated load distributions and the method includes:
for each evaluated load distribution among the plurality of evaluated load distributions, measuring heat output from the test heat sink while the test component operates and the adjustable load cells maintain the second load distribution; and
selecting an optimal load distribution from among the plurality of evaluated load distributions, the optimal load distribution being an evaluated load distribution among the plurality of evaluated load distributions that results in a greatest measured heat output from the test heat sink while the test component operates.

14. The method of claim 13, wherein the test component is constructed according to a preliminary component design and the method includes creating a modified component design from the preliminary component design, wherein mounting the test heat sink to a component constructed according to the modified component design and tightening each of the adjustable load cells to a respective maximum possible load would create the optimal load distribution between the test heat sink and the component constructed according to the modified component design, and the respective maximum possible load of at least one of the adjustable load cells is limited by the modified component design.

15. The method of claim 14, wherein creating the modified component design includes altering a height of at least one standoff among a plurality of standoffs in the preliminary component design that are configured for coupling the adjustable load cells to a board in the preliminary component design so that the height of the at least one standoff differs from a height of another standoff among the plurality of standoffs.

16. The method of claim 13, wherein the test heat sink includes the adjustable load cells and is constructed according to a preliminary heat sink design and the method includes creating a modified heat sink design from the preliminary heat sink design, wherein mounting a modified heat sink constructed according to the modified heat sink design to the test component and tightening each load cell of the modified heat sink to a respective maximum possible load would create the optimal load distribution between the modified heat sink and the test component.

17. The method of claim 16, wherein creating the modified heat sink design includes causing at least one of the respective maximum possible loads to differ from a corresponding respective maximum possible load of a load cell in the preliminary heat sink design and from another of the respective maximum possible loads of the modified heat sink.

18. The method of claim 17, wherein creating the modified heat sink design includes designing each load cell of the modified heat sink design to include a spring that governs the respective maximum possible load of the load cell of the modified heat sink, with at least one of the springs having a different neutral length or spring constant than another of the springs.

19. The method of claim 17, wherein creating the modified heat sink design includes:
designing a first load cell among the load cells of the modified heat sink to include a first movable end, a first spring trapped between the first movable end and a first immovable load point of the modified heat sink, and a first washer trapped between the first spring of the first load cell and the first movable end or the first immovable load point; and
designing a second load cell among the load cells of the modified heat sink to include a second movable end and a second spring trapped between the second movable end and a second immovable load point of the modified heat sink and to either be free of washers between the second movable end and the second immovable load point or to include a second washer trapped between the spring and the second end or the second immovable load point having a different thickness than the first washer.

20. The method of claim 17, wherein creating the modified heat sink design includes designing each load cell of the modified heat sink design to apply load to a respective immovable load point of the modified heat sink design, at least one of the immovable load points being spaced from a heat receiving surface of the heat sink that is configured to contact the test component by a different distance than a distance by which another of the immovable load points is spaced from the heat receiving surface.

* * * * *